(12) United States Patent
Nakashiba

(10) Patent No.: US 7,737,558 B2
(45) Date of Patent: Jun. 15, 2010

(54) SEMICONDUCTOR DEVICE WITH A HIGH-FREQUENCY INTERCONNECT

(75) Inventor: Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/046,496

(22) Filed: Mar. 12, 2008

(65) Prior Publication Data

US 2008/0224262 A1 Sep. 18, 2008

(30) Foreign Application Priority Data

Mar. 12, 2007 (JP) ............................ 2007-061985

(51) Int. Cl.
- H01L 23/48 (2006.01)
- H01L 23/52 (2006.01)
- H01L 29/40 (2006.01)
- H01L 27/10 (2006.01)
- H01L 29/73 (2006.01)
- H01L 29/74 (2006.01)

(52) U.S. Cl. ..................... 257/758; 257/207; 257/208; 257/211; 257/E21.453

(58) Field of Classification Search ......... 257/207–208, 257/211, 758, E21.453
See application file for complete search history.

(56) References Cited

U.S. PATENT DOCUMENTS

| | | | | |
|---|---|---|---|---|
| 5,683,937 A * | 11/1997 | Furukawa et al. | ............. | 438/42 |
| 6,413,847 B1 * | 7/2002 | Yeh et al. | ................... | 438/598 |
| 6,518,633 B2 * | 2/2003 | Mori et al. | ................. | 257/396 |
| 6,710,449 B2 * | 3/2004 | Hyoto et al. | ................ | 257/758 |
| 6,779,164 B2 * | 8/2004 | Ohba et al. | ................... | 716/11 |
| 6,943,129 B2 * | 9/2005 | Hyoto et al. | ................ | 438/128 |
| 6,998,653 B2 * | 2/2006 | Higuchi | ..................... | 257/211 |
| 7,091,614 B2 * | 8/2006 | Cheng et al. | ................ | 257/758 |
| 7,135,366 B2 * | 11/2006 | Rotella | ........................ | 438/238 |
| 7,432,179 B2 * | 10/2008 | Chuang et al. | ............. | 438/551 |
| 7,566,647 B2 * | 7/2009 | Hou | ............................ | 438/612 |
| 7,573,697 B2 * | 8/2009 | Sato et al. | ................ | 361/306.1 |
| 7,598,522 B2 * | 10/2009 | Yaegashi et al. | ............. | 257/48 |
| 2004/0095042 A1 * | 5/2004 | Sube et al. | ................. | 310/328 |
| 2004/0212015 A1 * | 10/2004 | Huang et al. | ................ | 257/355 |
| 2005/0012157 A1 * | 1/2005 | Ryoo et al. | ................. | 257/368 |
| 2005/0030403 A1 * | 2/2005 | Yaung et al. | ................ | 348/308 |
| 2005/0140269 A1 * | 6/2005 | Hwang | ........................ | 313/497 |
| 2005/0248033 A1 * | 11/2005 | Ryan | ........................... | 257/758 |

(Continued)

FOREIGN PATENT DOCUMENTS

JP 2001-267322 A 9/2001

OTHER PUBLICATIONS

Ali Hajimiri et al., "Design Issues in CMOS Differential LC Oscillators", IEEE Journal of Solid-State Circuits, vol. 34, No. 5, May 1999, pp. 717-724.

*Primary Examiner*—Ida M Soward
(74) *Attorney, Agent, or Firm*—Young & Thompson

(57) ABSTRACT

Provided is a semiconductor device having a high-frequency interconnect, first dummy conductor patterns, an interconnect, and second dummy conductor patterns. The first dummy conductor patterns are arranged in the vicinity of the high-frequency interconnect, and the second dummy conductor patterns are arranged in the vicinity of the interconnect. The minimum value of distance between the high-frequency interconnect and the first dummy conductor patterns is larger than the minimum value of distance between the interconnect and the second dummy conductor patterns.

12 Claims, 4 Drawing Sheets

U.S. PATENT DOCUMENTS

| | | |
|---|---|---|
| 2006/0096778 A1* | 5/2006 | Yun .......................... 174/255 |
| 2006/0097395 A1* | 5/2006 | Cheng et al. ................. 257/758 |
| 2006/0226485 A1* | 10/2006 | Arakawa .................... 257/347 |
| 2007/0030628 A1* | 2/2007 | Yamamoto et al. .......... 361/311 |
| 2007/0057338 A1* | 3/2007 | Lee et al. .................... 257/432 |
| 2007/0108628 A1* | 5/2007 | Ozawa et al. ............... 257/778 |
| 2007/0195763 A1* | 8/2007 | Onodera .................... 370/389 |
| 2008/0128924 A1* | 6/2008 | Liu et al. .................... 257/797 |
| 2008/0283970 A1* | 11/2008 | Uchiyama et al. .......... 257/620 |
| 2009/0178837 A1* | 7/2009 | Kawabata et al. ........... 174/261 |

* cited by examiner

SEMICONDUCTOR DEVICE WITH A HIGH-FREQUENCY INTERCONNECT

This application is based on Japanese patent application No. 2007-061985 the content of which is incorporated hereinto by reference.

BACKGROUND

1. Technical Field

The present invention relates to a semiconductor device.

2. Related Art

FIG. 3 is a plan view showing a conventional semiconductor device. In a semiconductor device 100, dummy conductor patterns 102 are arranged in the vicinity of a high-frequency interconnect 101. The dummy conductor patterns are provided for the purpose of suppressing production of pits, called erosion, which tends to occur in the process of CMP when a pattern of an interconnect layer has dense and scarce portions. More specifically, provision of the dummy conductor patterns 102 facilitates processing of a layer containing the high-frequency interconnect 101 when the semiconductor device 100 is manufactured. The high-frequency interconnect 101 herein functions as an inductor.

Preceding technical literatures relevant to the present invention may be exemplified by Japanese Laid-Open Patent Publication No. 2001-267322, and Ali Hajimiri et al., "Design Issues in CMOS Differential LC Oscillators", IEEE JOURNAL OF SOLID-STATE CIRCUITS, Vol. 34, No. 5, May 1999, pp. 717-724.

A problem, however, arises when high-frequency current flows through the high-frequency interconnect 101 in the semiconductor device 100 shown in FIG. 3. More specifically, eddy current may be produced in the dummy conductor pattern 102 in the vicinity of the high-frequency interconnect as shown in FIG. 4, due to a magnetic field induced around the high-frequency interconnect 101. The drawing is a plan view showing an enlarged view of the portion surrounded by the dashed line in FIG. 3. Arrow A1 in the drawing expresses the direction of current flowing through the high-frequency interconnect 101, and arrows A2 express the direction of eddy current flowing in the dummy conductor pattern 102.

When the eddy current appears in this way, another magnetic field will appear in the direction of canceling the above-described magnetic field, based on Lentz's law. Circuit constants of the high-frequency interconnect 101 may fluctuate, and as a consequence, transmission characteristics of the high-frequency interconnect 101 may fluctuate.

SUMMARY

According to the present invention, there is provided a semiconductor device which includes a first interconnect as a high-frequency interconnect; first dummy conductor patterns arranged in the vicinity of the first interconnect; a second interconnect; and second dummy conductor patterns arranged in the vicinity of the second interconnect, wherein a minimum value of distance between the first interconnect and the first dummy conductor patterns is larger than a minimum value of distance between the second interconnect and the second dummy conductor patterns.

In the semiconductor device, the first dummy conductor patterns are arranged sufficiently apart from the first interconnect. By virtue of this configuration, the eddy current possibly appears in the first dummy conductor patterns may be weakened, even if high-frequency current flows through the first interconnect, and thereby fluctuation in the circuit constants of the first interconnect may be suppressed to a low level.

According to the present invention, a semiconductor device possibly improved in the transmission characteristics of the interconnect may be realized.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
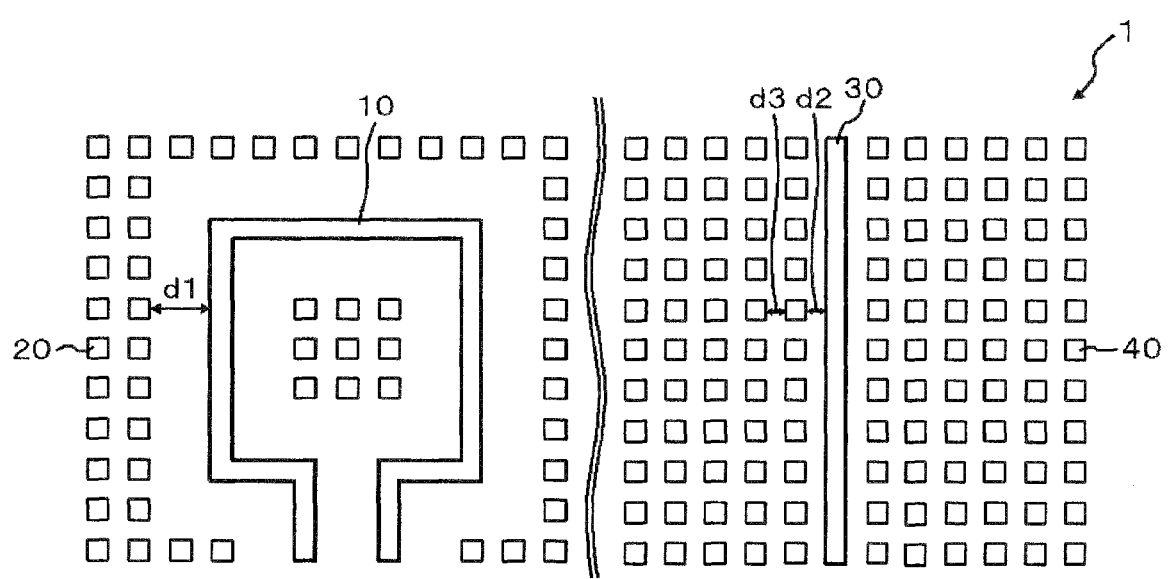
FIG. 1 is a plan view showing one embodiment of the semiconductor device according to the present invention.

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will detail a preferred embodiment of the present invention, referring to the attached drawings. It is to be noted that any identical constituents will be given with the same reference numerals, and explanations therefor will not be repeated.

FIG. 1 is a plan view showing one embodiment of the semiconductor device according to the present invention. A semiconductor device 1 has a high-frequency interconnect 10 (first interconnect), dummy conductor patterns 20 (first dummy conductor patterns), an interconnect 30 (second interconnect), and dummy conductor patterns 40 (second dummy conductor patterns). The high-frequency interconnect 10, the dummy conductor patterns 20, the interconnect 30 and the dummy conductor patterns 40 are formed in the same layer. The high-frequency interconnect 10 allows an electric current having a frequency of 5 GHz, for example, to flow therethrough. The high-frequency interconnect 10 has a coil form, and functions as an inductor. The interconnect 30 is an interconnect other than the high-frequency interconnect.

In the vicinity of the high-frequency interconnect 10, a plurality of dummy conductor patterns 20 are arranged. The dummy conductor patterns 20 are provided for the purpose of facilitating processing of a layer containing the high-frequency interconnect 10 (more specifically, a region of the layer in the vicinity of the high-frequency interconnect 10) in the process of manufacturing the semiconductor device 1.

The dummy conductor patterns 20 are provided on both sides of the high-frequency interconnect 10. Because the high-frequency interconnect 10 in this embodiment is formed in a coil form as described in the above, the dummy conductor patterns 20 are provided on both of an inside and an outside of a region surrounded by the high-frequency interconnect 10.

In the vicinity of the interconnect 30, a plurality of dummy conductor patterns 40 are arranged. The dummy conductor patterns 40 are provided for the purpose of facilitating processing of a layer containing the interconnect 30 (more specifically, a region of the layer in the vicinity of the interconnect 30) in the process of manufacturing the semiconductor device 1. The dummy conductor patterns 40 are provided on both sides of the interconnect 30.

The high-frequency interconnect 10, the dummy conductor patterns 20, the interconnect 30 and the dummy conductor patterns 40 are composed of the same material. This sort of material may be exemplified by copper, aluminum, and so forth. For the case where the high-frequency interconnect 10, the dummy conductor patterns 20, the interconnect 30 and the dummy conductor patterns 40 are composed of copper, they may typically be formed by the damascene process. The high-frequency interconnect 10, the dummy conductor patterns 20, the interconnect 30 and the dummy conductor patterns 40 are formed at the same time.

As is known from FIG. 1, the minimum value d1 of distance between the high-frequency interconnect 10 and the dummy conductor patterns 20 is larger than the minimum value d2 of distance between the interconnect 30 and the dummy conductor patterns 40. The minimum value d1 is preferably twice or more as large and the minimum value d2. The minimum value d1 is also preferably 10 times or less as large as the minimum value d2. The minimum value d2 herein may be same with distance d3 between the adjacent dummy conductor patterns 40, or may be different therefrom.

Effects of this embodiment will be explained. In the semiconductor device 1, the dummy conductor patterns 20 are arranged sufficiently apart from the high-frequency interconnect 10. By virtue of this configuration, the eddy current possibly appears in the dummy conductor patterns 20 may be weakened, and thereby fluctuation in the circuit constants of the first interconnect may be suppressed to a low level. Accordingly, the semiconductor device 1 improved in the transmission characteristics of the high-frequency interconnect 10 may be realized.

For the case where the minimum value d1 of distance between the high-frequency interconnect 10 and each of the dummy conductor patterns 20 is twice or more as large as the minimum value d2 of distance between the interconnect 30 and each of the dummy conductor pattern 40, the above-described effect, that is, the effect of suppressing fluctuation in the circuit constants of the high-frequency interconnect 10, may be obtained in an outstanding manner.

On the other hand, too large distance between the high-frequency interconnect 10 and each of the dummy conductor patterns 20 may impair the operation of the dummy conductor patterns 20 aimed at facilitating processing of the region in the vicinity of the high-frequency interconnect 10. However, the minimum value d1 adjusted 10 times or less as large as the minimum value d2 may successfully yield the above-described effects.

By virtue of provision of the dummy conductor patterns 20, flatness may more readily be obtained in the vicinity of the high-frequency interconnect 10 in the process of CMP of a layer containing the high-frequency interconnect 10, as compared with the case where the dummy conductor patterns 20 are not provided. Moreover, the dummy conductor patterns 20 are provided on both sides of the high-frequency interconnect 10. By virtue of this configuration, the CMP process of a layer containing the high-frequency interconnect 10 may further be facilitated, as compared with the case where the dummy conductor patterns 20 are provided only on one side of the high-frequency interconnect 10. Similarly, by virtue of provision of the dummy conductor patterns 40, flatness may more readily be obtained in the vicinity of the interconnect 30 in the process of CMP of a layer containing the interconnect 30, as compared with the case where the dummy conductor patterns 40 are not provided. Moreover, the dummy conductor patterns 40 are provided on both sides of the interconnect 30. By virtue of this configuration, the CMP process of a layer containing the interconnect 40 may further be facilitated, as compared with the case where the dummy conductor patterns 40 are provided only on one side of the interconnect 30.

In this embodiment, the high-frequency interconnect 10 is an inductor. In this case, if a magnetic field is induced in the direction canceling a magnetic field induced by the inductor due to the eddy current, intensity of the magnetic field induced by the inductor may consequently be lowered. The lowering in the magnetic field may result in degradation in the Q value of the inductor. On the contrary, in this embodiment, the eddy current may be suppressed as described in the above, and thereby the degradation of the Q value may be suppressed to a low level.

The above-described problem, that is a problem in that the circuit constants of the high-frequency interconnect 10 may fluctuate due to the eddy current in the dummy conductor patterns 20, may be more distinctive when an electric current of 5 GHz or higher flows through the high-frequency interconnect 10. Therefore in such a case, effectiveness of this embodiment capable of suppressing the eddy current in the dummy conductor patterns 20 may particularly be outstanding.

Figure 2:
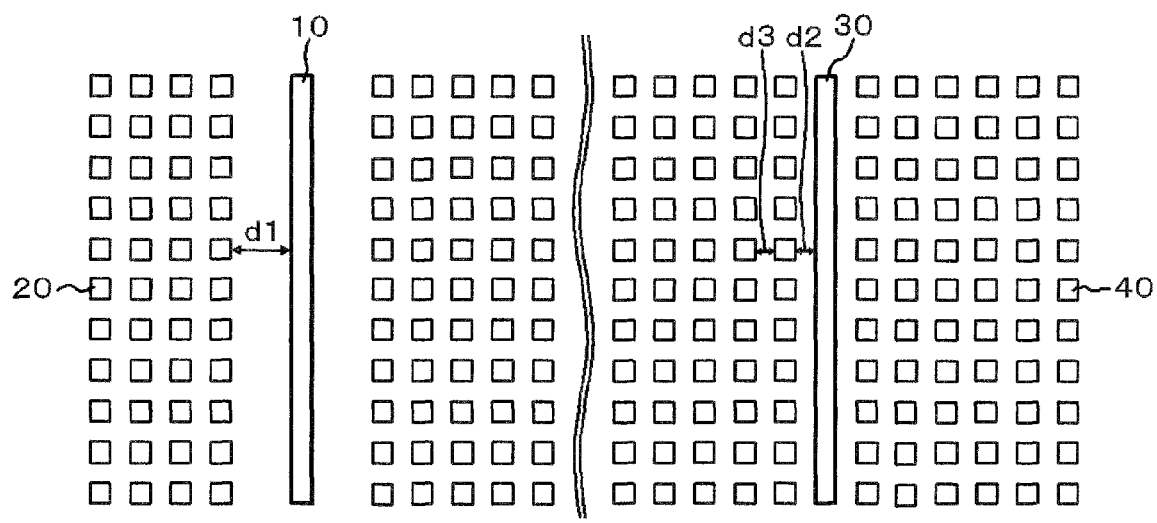
FIG. 2 is a plan view showing a modified example of the embodiment.
Figure 3:
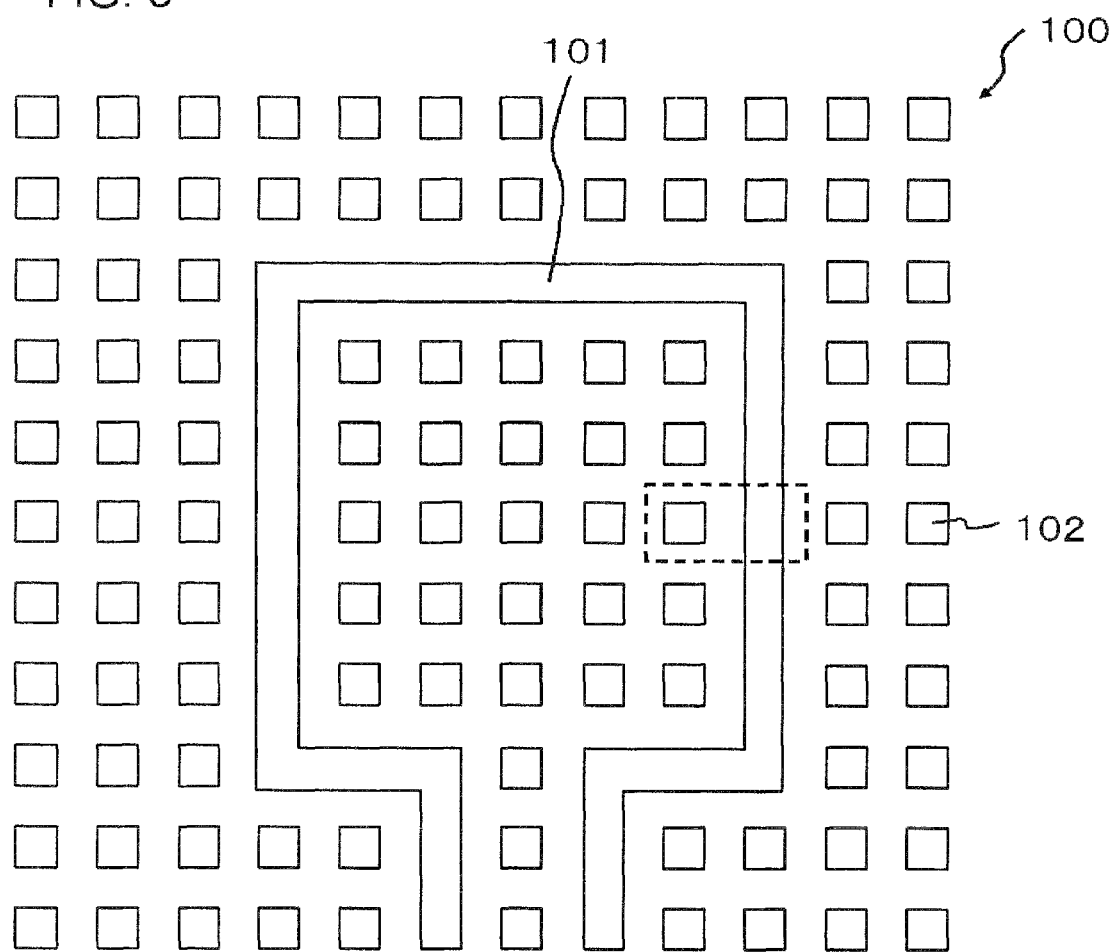
FIG. 3 is a plan view showing a conventional semiconductor device.
Figure 4:
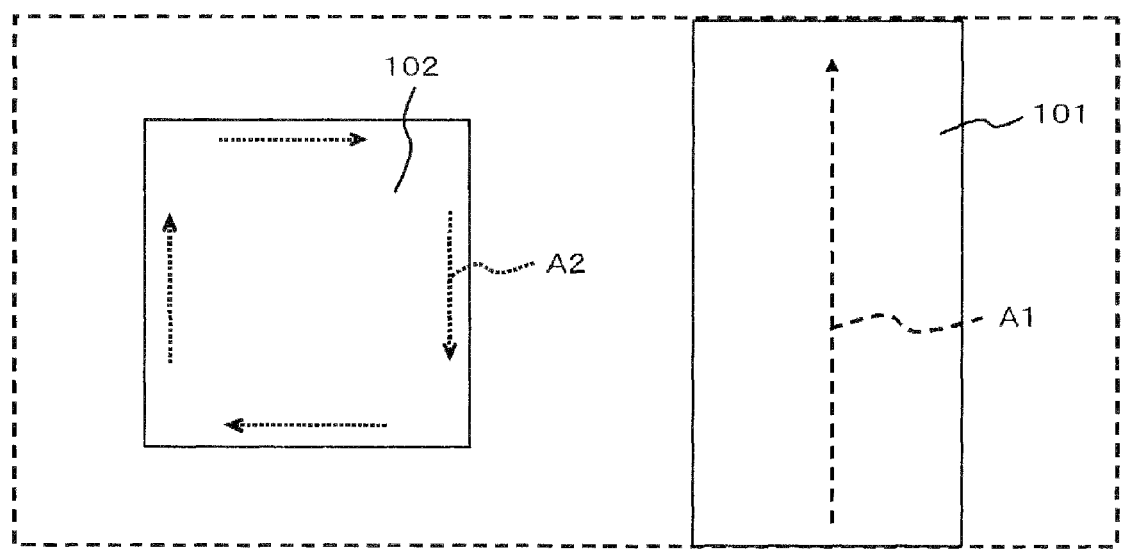
FIG. 4 is a plan view explaining a problem in the conventional semiconductor device.

The present invention is by no means limited to the above-described embodiment, but instead allows various modifications. Although the high-frequency interconnect 10 was exemplified as an inductor in the above-described embodiment, the high-frequency interconnect 10 may be a general high-frequency interconnect as shown in FIG. 2. Also in this drawing, the minimum value d1 of distance between the high-frequency interconnect 10 and the dummy conductor patterns 20 is larger than the minimum value d2 of distance between the interconnect 30 and the dummy conductor patterns 40.

It is apparent that the present invention is not limited to the above embodiment, that may be modified and changed without departing from the scope and spirit of the invention.

What is claimed is:

1. A semiconductor device having an interconnect layer comprising:
    a first interconnect configured to conduct an electric current with a high-frequency;
    first dummy conductor patterns provided in a same layer as said first interconnect, said first dummy conductor patterns being arranged in the vicinity of said first interconnect;
    a second interconnect provided in the same layer as said first interconnect; and
    second dummy conductor patterns provided in the same layer as said first interconnect, said second dummy conductor patterns being arranged in a vicinity of said second interconnect,
    wherein, in a plan view, a minimum value of distance between said first interconnect and said first dummy conductor patterns is larger than a minimum value of distance between said second interconnect and said second dummy conductor patterns.

2. The semiconductor device as claimed in claim 1,
    wherein said first interconnect is an interconnect configured to conduct an electric current with a frequency of at least 5 GHz therethrough.

3. The semiconductor device as claimed in claim 1,
    wherein said first dummy conductor patterns are provided on both sides of said first interconnect, and
    wherein said second dummy conductor patterns are provided on both sides of said second interconnect.

4. The semiconductor device as claimed in claim 1,
wherein said first interconnect is configured to function as an inductor.

5. The semiconductor device as claimed in claim 4,
wherein said first interconnect has a coil form, and said first dummy conductor patterns are provided on both of an inside and an outside of a region surrounded by said first interconnect.

6. The semiconductor device as claimed in claim 5,
wherein said second dummy conductor patterns are provided on both sides of said second interconnect.

7. A semiconductor device, comprising:
a first interconnect as a high-frequency interconnect;
first dummy conductor patterns arranged in a vicinity of said first interconnect;
a second interconnect; and
second dummy conductor patterns arranged in a vicinity of said second interconnect,
wherein a minimum value of distance between said first interconnect and said first dummy conductor patterns is larger than a minimum value of distance between said second interconnect and said second dummy conductor patterns,
wherein said first dummy conductor patterns are provided on two sides of said first interconnect, and
wherein said second dummy conductor patterns are provided on two sides of said second interconnect.

8. The semiconductor device as claimed in claim 7,
wherein a minimum value of distance between said first interconnect and said first dummy conductor pattern is at least twice as large as a minimum value of distance between said second interconnect and said second dummy conductor patterns.

9. The semiconductor device as claimed in claim 7,
wherein said first interconnect is an interconnect configured to allow an electric current having a frequency of at least 5 GHz to flow therethrough.

10. The semiconductor device as claimed in claim 7,
wherein said first interconnect is configured to function as an inductor.

11. The semiconductor device as claimed in claim 10,
wherein said first interconnect has a coil form, and
wherein said first dummy conductor patterns are provided on both of an inside and an outside of a region surrounded by said first interconnect.

12. A semiconductor device, comprising:
a first interconnect configured to conduct an electric current with a high-frequency;
first dummy conductor patterns arranged in a vicinity of said first interconnect;
a second interconnect; and
second dummy conductor patterns arranged in a vicinity of said second interconnect,
wherein a minimum value of distance between said first interconnect and said first dummy conductor patterns is larger than a minimum value of distance between said second interconnect and said second dummy conductor patterns,
wherein said first interconnect is configured to function as an inductor,
wherein said first interconnect has a coil form, and
wherein said first dummy conductor patterns are provided on both of an inside and an outside of a region surrounded by said first interconnect.

* * * * *